US008963318B2

(12) United States Patent
Yap

(10) Patent No.: US 8,963,318 B2
(45) Date of Patent: Feb. 24, 2015

(54) PACKAGED SEMICONDUCTOR DEVICE

(71) Applicant: Weng F. Yap, Phoenix, AZ (US)

(72) Inventor: Weng F. Yap, Phoenix, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/781,732

(22) Filed: Feb. 28, 2013

(65) Prior Publication Data

US 2014/0239497 A1 Aug. 28, 2014

(51) Int. Cl.

*H01L 23/495* (2006.01)
*H01L 23/04* (2006.01)
*H01L 23/34* (2006.01)
*H01L 23/538* (2006.01)
*H01L 21/82* (2006.01)
*H01L 23/498* (2006.01)
*H01L 21/56* (2006.01)
*H01L 23/00* (2006.01)
*H01L 25/065* (2006.01)

(52) U.S. Cl.

CPC ............ *H01L 23/5384* (2013.01); *H01L 21/82* (2013.01); *H01L 23/49816* (2013.01); *H01L 21/568* (2013.01); *H01L 24/19* (2013.01); *H01L 24/20* (2013.01); *H01L 25/0652* (2013.01); *H01L 25/0657* (2013.01); *H01L 2224/12105* (2013.01); *H01L 2224/32145* (2013.01); *H01L 2224/48091* (2013.01); *H01L 2224/48137* (2013.01); *H01L 2224/48227* (2013.01); *H01L 2224/73265* (2013.01); *H01L 2224/73267* (2013.01); *H01L 2225/0651* (2013.01); *H01L 2924/15311* (2013.01); *H01L 2924/15321* (2013.01); *H01L 2924/15331* (2013.01); *H01L 2225/06568* (2013.01)

USPC ............................ 257/698; 257/676; 257/723

(58) Field of Classification Search

None

See application file for complete search history.

(56) References Cited

U.S. PATENT DOCUMENTS

| | | | | |
|---|---|---|---|---|
| 6,798,049 | B1 | 9/2004 | Shin et al. | |
| 8,216,918 | B2 | 7/2012 | Gong et al. | |
| 2003/0151147 | A1 | 8/2003 | Chung et al. | |
| 2003/0157747 | A1 | 8/2003 | Chen et al. | |
| 2008/0142254 | A1 * | 6/2008 | Wang et al. | 174/259 |
| 2008/0237831 | A1 * | 10/2008 | Hsu et al. | 257/691 |
| 2008/0237833 | A1 * | 10/2008 | Hsu et al. | 257/691 |
| 2010/0006331 | A1 * | 1/2010 | Hsu | 174/260 |
| 2010/0021565 | A1 | 1/2010 | Handrosch et al. | |
| 2010/0096740 | A1 * | 4/2010 | Kim | 257/686 |

* cited by examiner

*Primary Examiner* — William F Kraig
*Assistant Examiner* — Khaja Ahmad

(57) ABSTRACT

A packaged semiconductor device includes a substrate including a first major surface, a second major surface, first vias running between the first major surface and the second major surface, first contact pads contacting the first vias at the first major surface, second contact pads contacting the first vias at the second major surface, and an opening between the first major surface and the second major surface. A first integrated circuit (IC) die is positioned in the opening in the substrate. Electrical connections are formed between the second IC die and the second contact pads. A first conductive layer is over the first contact pads and contact pads on the first IC die. Encapsulating material is on the second major surface of the substrate around the first IC die, the second IC die, the electrical connections, and between edges of the opening and edges of the first IC die.

17 Claims, 5 Drawing Sheets

PACKAGED SEMICONDUCTOR DEVICE

BACKGROUND

1. Field

This disclosure relates generally to forming semiconductor devices, and more specifically, to forming semiconductor packages having more than one device.

2. Related Art

It is desirable to provide semiconductor packages that include multiple processor and/or memory die. One manufacturing process includes forming electrical contacts on both sides of a substrate (i.e., double sided build up or 3D (three dimensional) structure. To form a 3D structure, thru vias are formed within a substrate to provide connections between the top surface and the bottom surface of a substrate. The thru vias can be difficult to manufacture and may have electrical and mechanical weaknesses. During the build up process, residual stresses are created, which causes panels to undesirably warp. In addition, the cost of the double-sided build up is high due to the many processing steps of the process. Additionally, dielectric material used to retain the die in the cavity may crack during manufacturing processes such as wire bonding. Hence, a need exists for a method to form a 3D structure, that does not have the disadvantages of the prior art.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods disclosed herein provide packaged semiconductor devices that include redistributed chip package (RCP) or similar embedded wafer level packages in combination with die that are wire bonded to another die or to a package substrate. In one embodiment, a prefabricated substrate includes circuits on both sides, vias interconnecting the circuits, and a cavity opening for receiving one or more integrated circuit die is used. A tape or similar material can be used during processing to hold an active side of the die level with the surface of the substrate and protect the active surface of the semiconductor die. In one embodiment, a mold compound is used to encapsulate and retain the die in the cavity. Contact pads on the active side of the die are exposed after the tape is removed and can then be connected to another electrical device.

Figure 1:
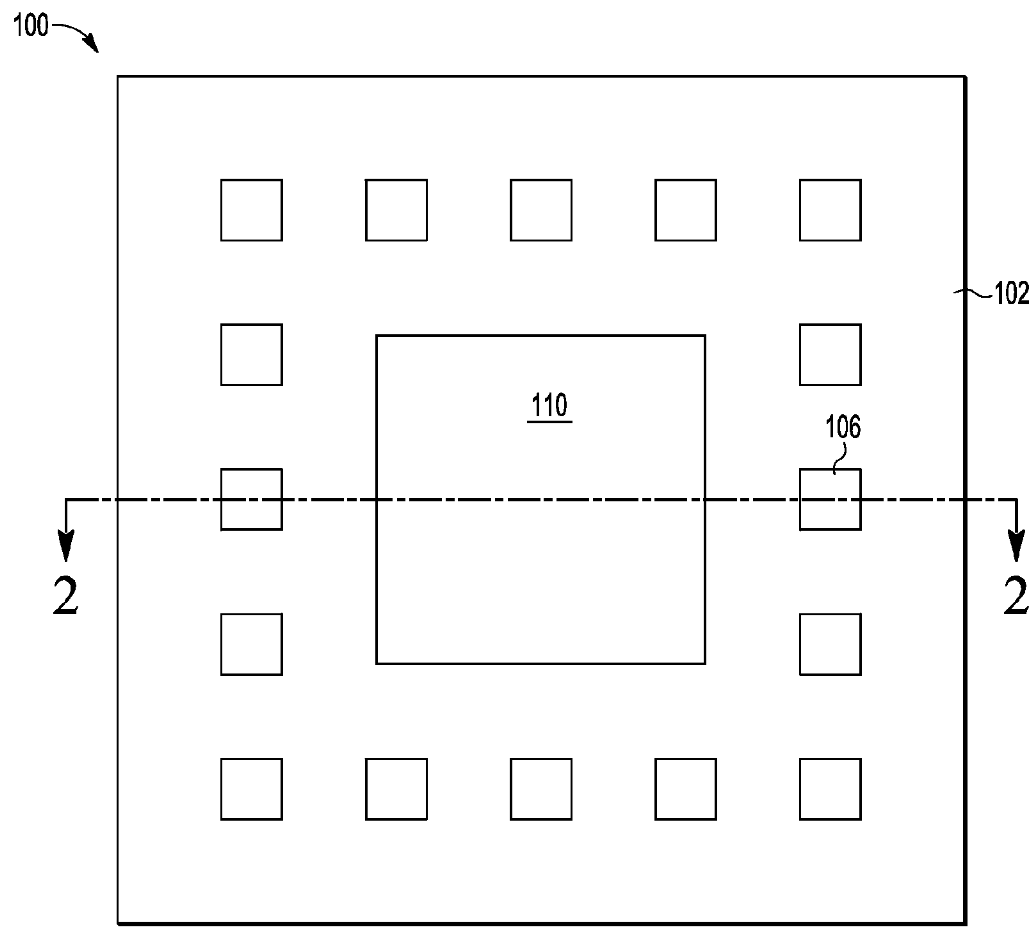
FIG. 1 illustrates a bottom view of an embodiment of a substrate to be used in manufacturing a semiconductor device in accordance with an embodiment.

FIG. 1 illustrates a bottom view of an embodiment of an integrated circuit (IC) package substrate 102 to be used in manufacturing a semiconductor device 100 in accordance with an embodiment. Substrate 102 includes electrically conductive pads 106 around an opening or cavity 110 completely through the thickness of substrate 102. Substrate 102 can include conductive traces, traces, and other circuit elements. The bulk material of substrate 102 can be formed of any suitable material, such as a glass fiber reinforced insulation material or other non-conductive material. The outline or planform area of opening 110 as viewed in FIG. 1 can be larger than the outline or planform area of a semiconductor or integrated circuit die (not shown) that will be placed in the opening.

One or more die or other integrated circuit or semiconductor devices can be positioned in the opening 110. Encapsulating material (not shown) is applied between side edges of the opening 110 and the die or device(s) to retain the die or device(s) in the opening 110 during subsequent processing, as further described herein.

FIGS. 2-8 illustrate side cross-section views of an embodiment of the semiconductor device 100 during successive phases of manufacture.

Figure 2:
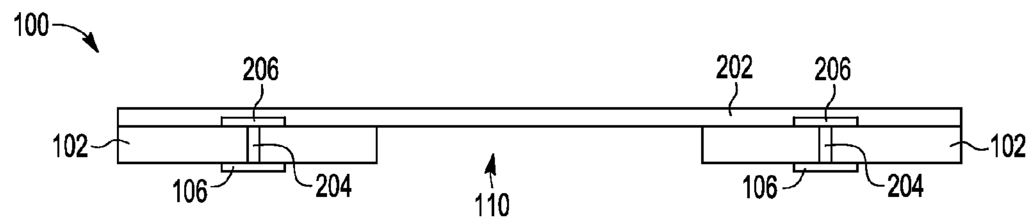
FIGS. 2-8 illustrate side cross-section views of embodiments of the semiconductor device during successive phases of manufacture.

In FIG. 2, adhesive tape 202 is placed in contact with a top side of substrate 102. In some embodiments, tape 202 is a thermoplastic material or other suitable material. Instead of the tape 202 any other material that can attach to a substrate 102 and release the substrate after further processing can be used.

As shown, substrate 102 is a circuit board with first vias 204 extending between the top surface and the bottom surface of substrate 102. Vias 204 may be formed by any suitable technique, such as mechanical or laser drilling followed by a fill or plating and planarization process. The vias 204 couple the contact pads 106 on the bottom side of substrate 102 to contact pads 206 formed on top side of the substrate 102. The contact pads 106, 206 and vias 204 form interconnects in the substrate 102. Conductive lines (not shown) may be formed on the surfaces of the substrate 102 to connect contact pads 106, 206 to other components. The contact pads 106, 206 and vias 204 are formed of conductive materials, and in one embodiment, include copper or any suitable conductive material.

Cavity 110, contact pads 106, 206 and vias 204 are formed in the substrate 102 (i.e., "pre-formed") before the substrate 102 is attached to tape 202. The outline or planform area of cavity 110 is larger than the planform or outline area of the IC die that will be placed into the cavity 110 in subsequent processing.

Figure 3:
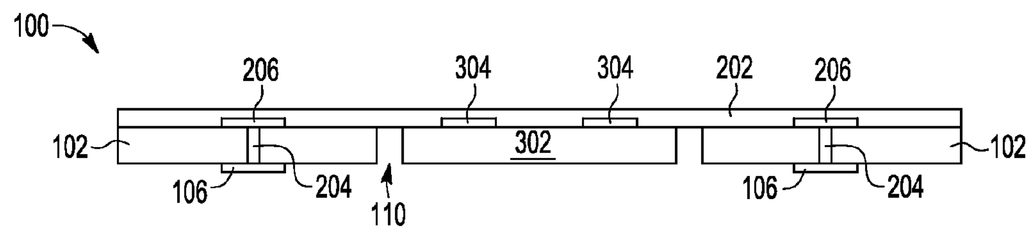

In FIG. 3, die 302 has been placed in the cavity 110 with an active side of die 302 facing an adhesive side of tape 202. The active surface of die 302 is held flush or coplanar with the surface of the top side of substrate 102. An active surface is a surface having contacts to electrical components formed in the die 302. The die 302 can be any integrated circuit device, such as a logic or memory device, a resistor, the like, or combinations of the above.

The die 302 includes contacts 304 formed on the active surface, of which two are illustrated by example. The contacts 304 are conductive and may include copper or any suitable conductive material. The die 302 may be placed into the cavity 110 using a pick-and-place tool used in the industry. In one embodiment, the die 302 (including the contacts 304) is coplanar with the top of the substrate 102 (including the contact pads 206) so that subsequently formed layers are substantially level. The die 302 is placed so that the active surface is exposed once tape 202 is removed. As shown in the illustrated embodiment, the surface of the die 302 is directly in contact with tape 202. Because the cavity 110 is wider than the die 302 and the die 302 is placed in the cavity 110 so that the sides are not in physical contact with the bulk material 15 of the substrate 102, openings or cavity 110 are formed on either side of the die 302. The cavities 110, as will be better understood after further discussion, are wide enough so that they can be filled with a mold compound, also referred to as encapsulating material or encapsulant, during subsequent processing.

Figure 4:
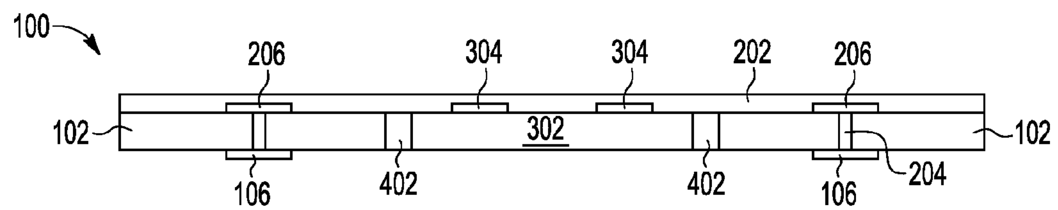

FIG. 4 illustrates the semiconductor device 100 of FIG. 3 after filling the cavity 110 and forming a layer over the non-active surface of the die 302 with encapsulant 402. In one embodiment, encapsulant 402 is formed in the cavity 110 and over the substrate 102 and die 302. Encapsulant 402 can be formed using film assisted molding (FAM) or other suitable method that covers the sides and non-active surface of the die 302 and fills in the area between the sides of die 302 and substrate 102. Any suitable mold compound 402 such as, but not limited to, an epoxy material filled with fused silica and other fillers or additives, can be used.

Figure 5:
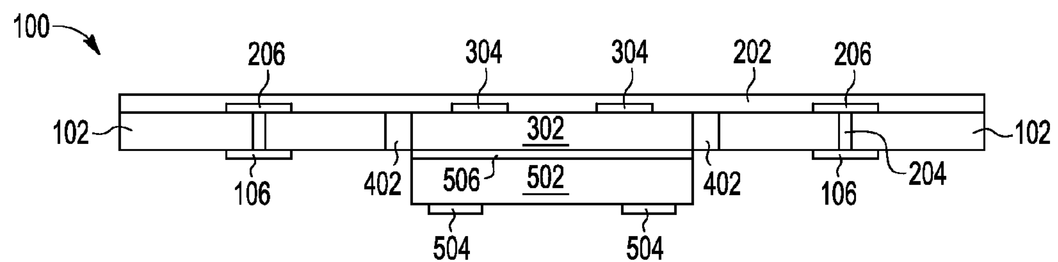

FIG. 5 illustrates the semiconductor device 100 of FIG. 4 after a second IC die 502 is attached using a layer of die attach material 506 between the encapsulant over the non-active surface of IC die 302 and a non-active surface of die 502. An active surface of die 502 including electrical contact pads 504 is exposed.

Figure 6:
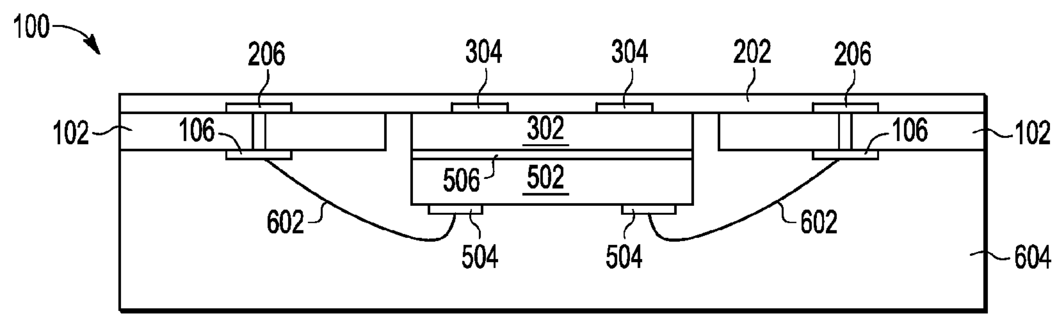

FIG. 6 illustrates the semiconductor device 100 of FIG. 5 after wire bonds 602 are formed between contact pads 504 on die 502 and contact pads 106 on substrate 102. Wire bonds 602 can be formed using any suitable electrically conductive material such as copper, aluminum or gold. Wire bonds 602 can be formed using any suitable technique such as wedge bonding, ball bonding or compliant bonding. Notably, encapsulant 402 is likely to withstand physical pressure imposed on device 100 when wire bonds 602 are formed, as well as during subsequent processing phases that may exert forces on semiconductor device 100. Accordingly, IC die 302 and 502 are held stable and electrical connections between IC die 302 and 502 and other components will be reliable.

Once wire bonds 602 are formed, encapsulant 604 can be formed over the exposed portions of wire bonds 602, IC die 502 and the side of substrate 102 that is not attached to tape 202. Encapsulant 604 can be formed using film assisted molding (FAM) or other suitable method and with any suitable mold compound 402 such as, but not limited to, an epoxy material filled with fused silica and other fillers or additives.

Figure 7:
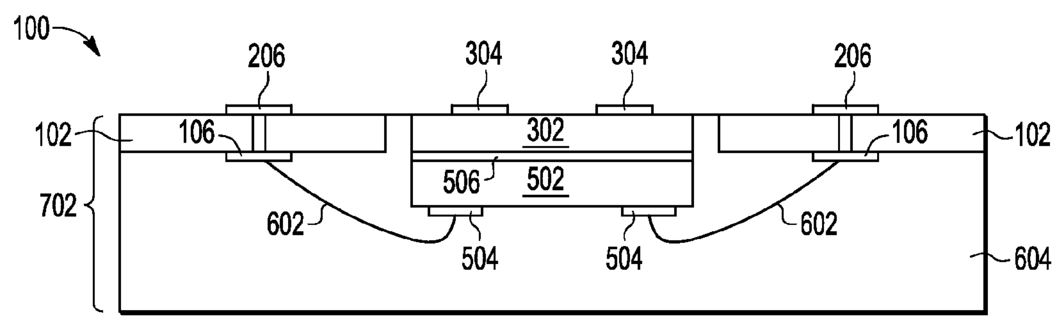

FIG. 7 illustrates the semiconductor device 100 of FIG. 6 after tape 202 is removed so that further processing can be performed over the active surface of die 302 and upper surface of substrate 102. The structure shown in FIG. 7 is referred to as a first or wire bond section 702 of semiconductor device 100. Tape 202 may be removed manually or automatically and a cleaning process may be performed to remove any residual adhesive.

Figure 8:
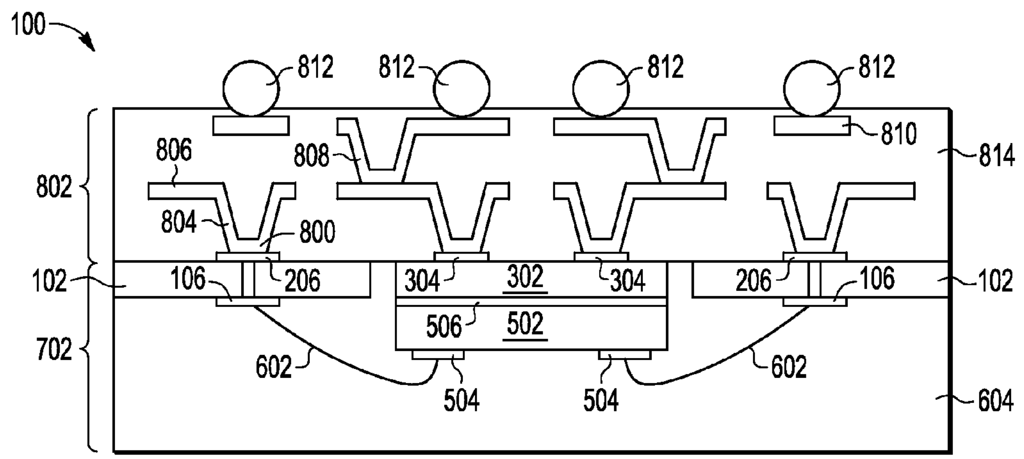

FIG. 8 illustrates the semiconductor device of FIG. 7 after forming a second or RCP section 802 that includes a first electrically conductive or metal layer with contact terminals 800 over contact pads 206, 304 on the respective upper surface of substrate 102 and active surface of die 302. After the first conductive layer is formed, an interlevel dielectric layer may be formed to insulate the first conductive layer from subsequent conductive layers. The dielectric layer may be any suitable dielectric material, such as WPR 10201 from JSR Corporation, a similar material, or combinations thereof. Openings may be formed in the dielectric layer and filled with a conductive material, which may include copper, to form vias 804 in contact with terminals 800. The openings for vias 804 may be formed, for example, using photolithography and may be filled when the next conductive layer is applied.

A second conductive layer is formed and patterned using similar processes and materials that can be used for the first conductive layer. The vias 804 may be filled at the same time. Vias 804 electrically connect the first conductive layer to the second conductive layer.

Openings in a dielectric layer between the first and second conductive layers can be formed and filled with conductive material to form vias 808 and connect the first and second conductive layers. The dielectric layers are collectively denoted as dielectric layers 814.

A solder mask can be formed over the second conductive layer and patterned to form openings exposing portions of the second conductive layer that are later filled with solder or other solderable metallurgy to form conductive terminals 810.

One or more external contact terminals, such as solder balls 812, are formed with each solder ball 812 in contact with a corresponding one of terminals 810. The openings in the dielectric material above each of terminals 810 can be formed using a solder mask that defines where the openings should be formed. The solder from the solder balls 812 may fill the opening in the solder mask. In other embodiments, other terminals may be used. For example, the openings may be filled with a conductive material and this conductive material may be the terminal. Solder balls 812 can be attached to other components to electrically couple the die 302 and/or 502 within the semiconductor device 100 to other devices external to semiconductor device 100. The semiconductor device 100 with solder balls 812 is just one example of packaging for semiconductor device 100. Any other suitable package can be used. In addition, additional packaged semiconductor devices may be formed over or adjacent the semiconductor device 100. Also, additional die or other electronic devices may be included in semiconductor device 100.

Figure 9:
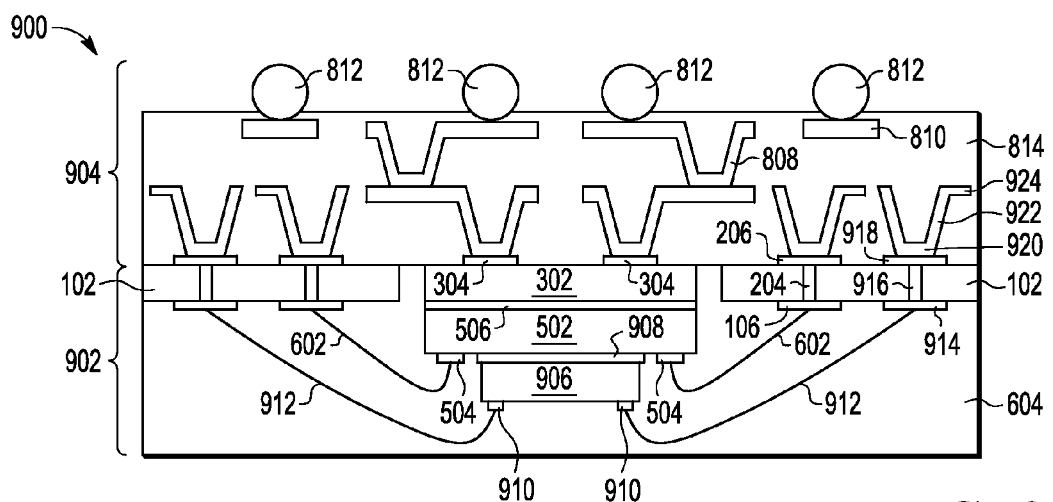
FIG. 9 illustrates a cross-section view of a semiconductor device in accordance with another embodiment of the invention.

Referring now to FIG. 9, a cross-section view of another embodiment of a packaged semiconductor device 900 is shown including a wire bond section 902 and an RCP section 904. Wire bond section 902 includes features similar to wire bond section 702 of FIG. 7, but also includes an additional IC die 906 mounted with die attach material 908 between contact pads 504 on die 502. Die 906 includes an active side with contact pads 910. Wire bonds 912 are connected between contact pads 910 and contact pads 914 on the bottom side of substrate 102. Encapsulant 604 is molded around die 906, wire bonds 912, contact pads 910 and 914, and other exposed portions of the bottom surface of substrate 102.

Substrate 102 also includes vias 916 that connect contact pads 914 with contact pads 918 on the top surface of substrate 102. Conductive layer 920 can be formed in contact with contact pads 918, and vias 922 can be formed in dielectric material 814 between conductive layers 918 and 924. Although vias and solder balls 812 are not shown in contact with conductive layer 924, additional vias (not shown) and solder balls 812 can be included in RCP section 904 to couple die 906 with external devices.

Figure 10:
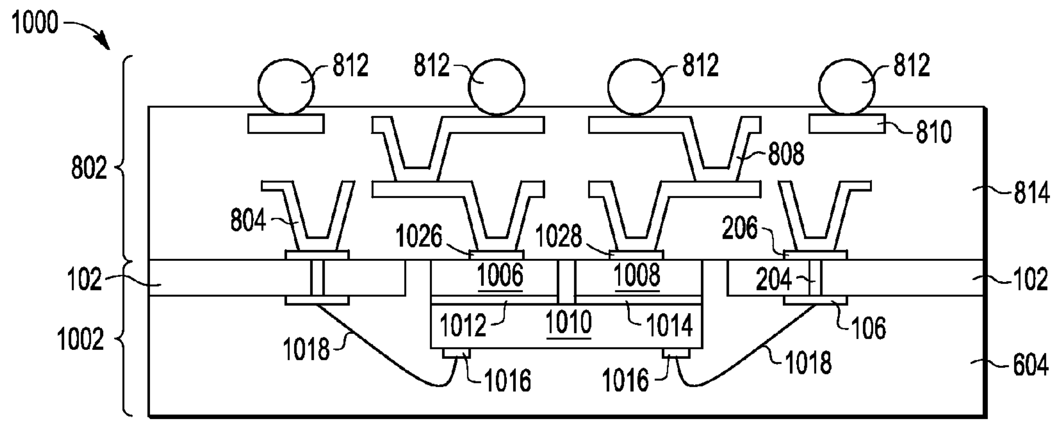
FIG. 10 illustrates a cross-section view of a semiconductor device in accordance with another embodiment of the invention.

FIG. 10 illustrates a cross-section view of a semiconductor device 1000 in accordance with another embodiment of the invention including a wire bond section 1002 and RCP section 802 (as first shown in FIG. 8). Wire bond section 1002 is similar to wire bond section 702 of FIG. 7, except wire bond section 1002 includes three die 1006, 1008, 1010. Die 1006, 1008 are mounted with their active surfaces coplanar with the top surface of substrate 102. Die 1006, 1008 are separated from each other by a small amount of encapsulant 604 filling the space between die 1006, 1008. An inactive or bottom surface of third die 1010 is mounted to encapsulant 604 over the bottom or inactive surface of die 1006 with die attach material 1012 and to encapsulant 604 over the bottom or inactive surface of die 1008 with die attach material 1014. Wire bonds 1018 are connected between contact pads 1016 on die 1010 and contact pads 106 on the bottom side of substrate 102. Encapsulant 604 is molded around die 1006-1010, wire bonds 1018, contact pads 1016 and 1020, and other exposed portions of the bottom surface of substrate 102.

Figure 11:
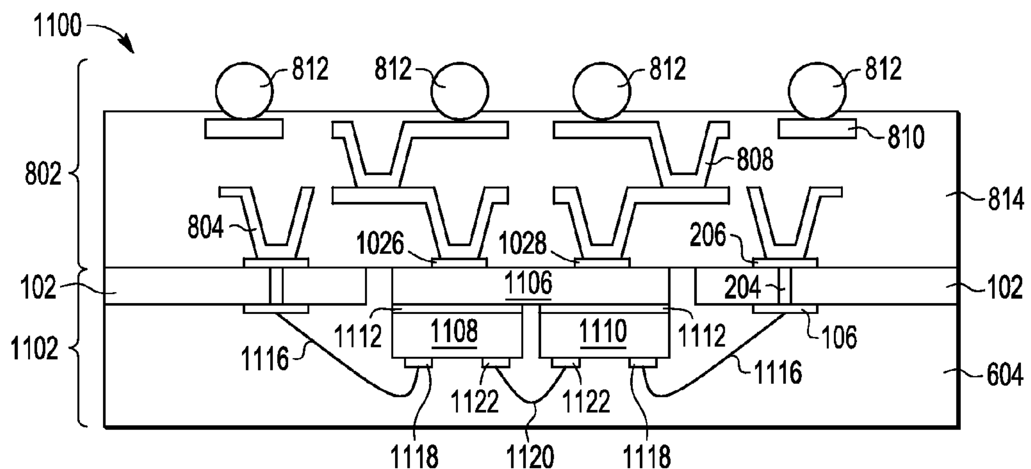
FIG. 11 illustrates a cross-section view of a semiconductor device in accordance with another embodiment of the invention.

FIG. 11 illustrates a cross-section view of a semiconductor device 1100 in accordance with another embodiment of the invention including a wire bond section 1102 and RCP section 802 (as first shown in FIG. 8). Wire bond section 1102 is similar to wire bond section 902 of FIG. 9 with three die 1106, 1108, 1110. However, one die 1106 is mounted with an active surface coplanar with the top surface of substrate 102. Inactive or bottom surfaces of second and third die 1108, 1110 are mounted to encapsulant 604 over the bottom or inactive surface of die 1006 with die attach material 1112. Die 1108, 1110 are separated from each other by a small amount of encapsulant 604 filling the space between die 1108, 1110. Wire bonds 1116 are connected between outer contact pads 1118 on the active surfaces of die 1108 and 1110 and contact pads 106 on the bottom side of substrate 102. Wire bonds 1120 can also be formed between inner contact pads 1122 on the active surfaces of die 1108 and 1110 to enable die 1108 and 1110 to communicate with one another. Encapsulant 604 is molded around die 1106-1110, wire bonds 1118, 1220, contact pads 1118 and 1120, and other exposed portions of the bottom surface of substrate 102.

Figure 12:
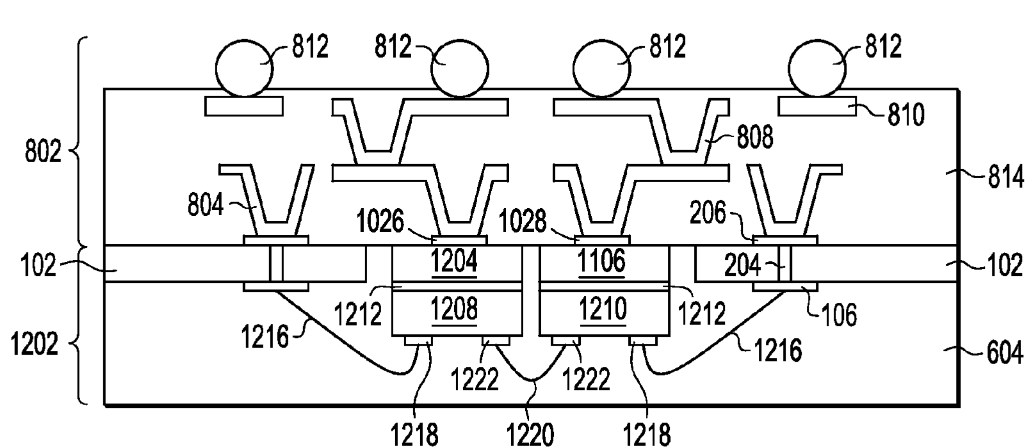
FIG. 12 illustrates a cross-section view of a semiconductor device in accordance with another embodiment of the invention.

FIG. 12 illustrates a cross-section view of a semiconductor device 1200 in accordance with another embodiment of the invention including a wire bond section 1202 and RCP section 802 (as first shown in FIG. 8). Wire bond section 1202 is similar to wire bond section 1102 of FIG. 11 but includes four die 1204, 1206, 1208, 1210. Two of the die 1204, 1206 are mounted with an active surface coplanar with the top surface of substrate 102. Inactive or bottom surfaces of third and fourth die 1208, 1210 are mounted to encapsulant 604 over the bottom or inactive surface of respective die 1204, 1206 with die attach material 1212. Die 1208, 1210 are separated from each other by a small amount of encapsulant 604 filling the space between die 1208, 1210. Wire bonds 1216 are connected between outer contact pads 1218 on the active surfaces of die 1208 and 1210 and contact pads 106 on the bottom side of substrate 102. Wire bonds 1220 can also be formed between inner contact pads 1222 on the active surfaces of die 1208 and 1210 to enable die 1208 and 1210 to communicate with one another. Encapsulant 604 is molded around die 1204-1210, wire bonds 1220, contact pads 1218 and other exposed portions of the bottom surface of substrate 102.

Figure 13:
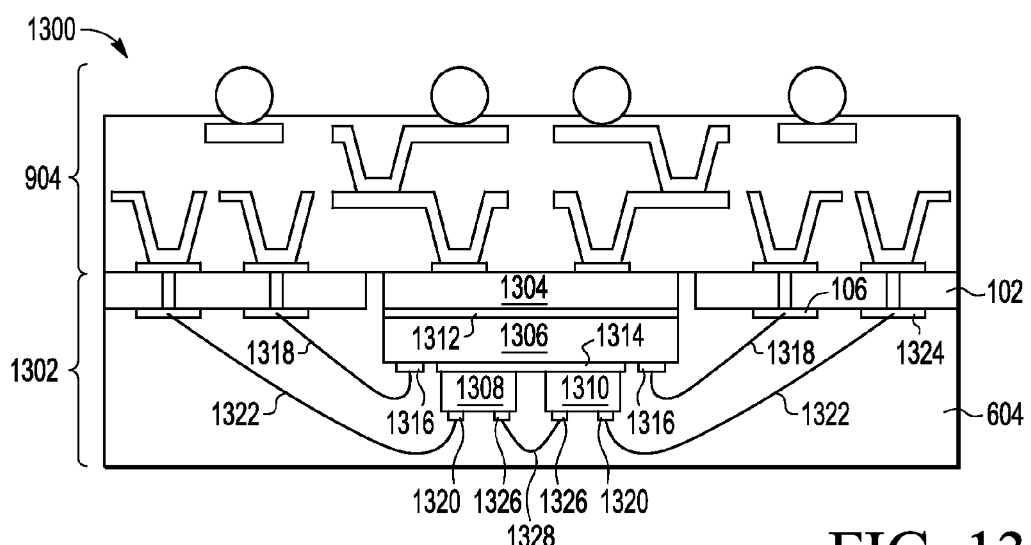
FIG. 13 illustrates a cross-section view of a semiconductor device in accordance with another embodiment of the invention.

FIG. 13 illustrates a cross-section view of a semiconductor device 1300 in accordance with another embodiment of the invention including a wire bond section 1302 and RCP section 904 (as first shown in FIG. 9). Wire bond section 1302 is similar to wire bond section 1200 of FIG. 12 with four die 1304, 1306, 1308, 1310, with die 1304, 1306 stacked one on top of the other instead of being mounted side by side as shown by die 1204, 1206. Die 1304 is mounted with an active surface coplanar with the top surface of substrate 102 and an inactive surface of die 1306 is mounted to encapsulant 604 over an inactive surface of die 1304 with die attach material 1312. Inactive or bottom surfaces of third and fourth die 1308, 1310 are mounted to an active surface of respective die 1306 with die attach material 1314. Die 1308, 1310 are separated from each other by a small amount of encapsulant 604 filling the space between die 1308, 1310. Wire bonds 1318 are connected between contact pads 1316 on die 1306 and contact pads 106 on the bottom side of substrate 102. Wire bonds 1322 are connected between outer contact pads 1320 on the active surfaces of die 1308 and 1310 and contact pads 1324 on the bottom side of substrate 102. Wire bonds 1328 can also be formed between inner contact pads 1326 on the active surfaces of die 1308 and 1310 to enable die 1308 and 1310 to communicate with one another. Encapsulant 604 is molded around die 1304-1310, wire bonds 1318, 1322, 1328, contact pads 106, 1316, 1320, 1324, 1326, and other exposed portions of the bottom surface of substrate 102.

Figure 14:
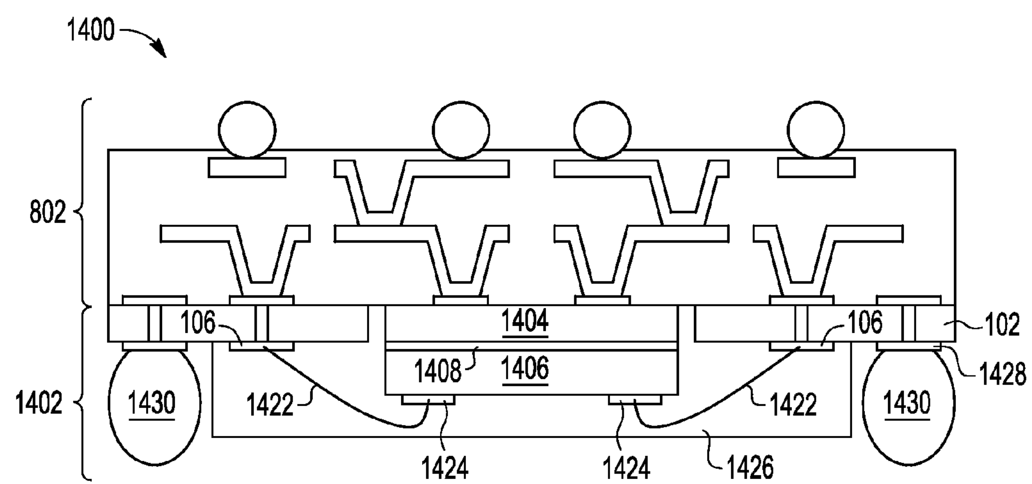
FIG. 14 illustrates a cross-section view of a semiconductor device in accordance with another embodiment of the invention.

FIG. 14 illustrates a cross-section view of a semiconductor device 1400 in accordance with another embodiment of the invention including a wire bond section 1402 and RCP section 802 (as first shown in FIG. 8). Wire bond section 1402 includes two die 1404, 1406 stacked one on top of the other. Die 1404 is mounted with an active surface coplanar with the top surface of substrate 102. An inactive surface of die 1406 is mounted to encapsulant 604 over an inactive surface of die 1404 with die attach material 1408. Wire bonds 1418 are connected between contact pads 1416 on die 1406 and contact pads 106 on the bottom side of substrate 102. Wire bonds 1422 are connected between outer contact pads 1424 on the active surfaces of die 1406 and contact pads 106 on the bottom surface of substrate 102. Encapsulant 1426 is molded around die 1404 and 1406, wire bonds 1422, contact pads 106. Contact pads 1428 are formed on the bottom surface of substrate 102 outside the perimeter of encapsulant 1426. Solder bumps 1430 are formed on contact pads 1428 and are higher than the height of encapsulant 1426 so that semiconductor device 1400 can be mounted on another circuit board or other component.

By now it should be appreciated that in some embodiments, there has been provided methods of forming a packaged semiconductor device that can include placing a first semiconductor die in an opening of a substrate. The first semiconductor die has an active surface and a non-active surface. The substrate has a first major surface and a second major surface which have the opening therethrough, first vias that extend between the first major surface and the second major surface, first contact pads terminating the vias at the first major surface, and second contact pads terminating the vias at the second major surface. Encapsulant material is applied in the opening around the first semiconductor die while leaving electrical contacts on the active surface of the first semiconductor die free of the encapsulant material. A non-active surface of a second semiconductor die is attached adjacent the non-active surface of the first semiconductor die. Electrical connections are formed between an active surface of the second semiconductor die and the second contact pads. Encapsulant material is applied around exposed portions of the second semiconductor die, the electrical connections, and the second contact pads. A first conductive layer of an interconnect level is formed over the first contact pads of the first major surface and contact pads on the active surface of the first semiconductor die.

In another aspect, the first major surface of the substrate and the active surface of the first die can be attached to adhesive tape prior to applying the encapsulant material in the opening.

In another aspect, the adhesive tape is removed after the applying encapsulant material in the opening and prior to the forming the first conductive layer.

In another aspect, the encapsulant material applied in the opening is further characterized by the encapsulant material being between sidewalls of the first semiconductor die and sidewalls of the opening.

In another aspect, after forming the first conductive layer, a first dielectric layer is formed over the first conductive layer. Openings are formed in the dielectric layer for a plurality of vias.

In another aspect, alternating conductive and dielectric layers are formed at a plurality of levels from the first dielectric layer.

In another aspect, solder balls are connected to contact pads at a last level of the plurality of levels, as shown for example in FIG. 8.

In another aspect, the substrate includes third contact pads 1428 on the second major surface. A non-active surface of a third semiconductor die is attached to an active surface of the second semiconductor die. Electrical connections are formed between the third semiconductor die and the third contact pads, as shown for example in FIG. 13.

In another aspect, the substrate has second vias that extend between the first major surface and the second major surface, the third contact pads terminating the second vias at the second major surface, and fourth contact pads terminating the second vias at the first major surface, as shown for example in FIG. 13.

In another aspect, the substrate includes third contact pads 1428 on the second major surface and the method further comprises connecting solder bumps 1430 to the third contact pads, as shown for example in FIG. 14.

In other embodiments, a packaged semiconductor device can comprise a first integrated circuit die positioned in an opening in a circuit board. The first integrated circuit die can have an active surface facing a same direction as a first major surface of the circuit board. The circuit board can further comprise a second major surface, first vias running between the first major surface and the second major surface, first contact pads contacting the first vias at the first major surface, and second contact pads contacting the first vias at the second major surface. The opening extending through the first major surface and the second major surface. Encapsulant material is placed around the first integrated circuit die in the opening and extends from sides of the first integrated circuit die to sides of the opening. The active surface of the first integrated circuit die remaining free of the encapsulant material. A second integrated circuit die is adjacent a non-active surface of the first integrated circuit die. Wire bonds are between the second integrated circuit die and the second contact pads. A first conductive layer over the first major surface contacting the first contact pads and contact pads on the active surface of the first integrated circuit die.

In another aspect, encapsulant material can be placed around the second integrated circuit die and the wire bonds.

In another aspect, solder balls can be formed between the electrical device and the first contact pads.

In another aspect, additional conductive layers can be separated by interlevel dielectric layers over the first conductive layer. The additional conductive layers can eb interconnected with vias.

In another aspect, solder balls can be connected to contact pads at a last level of the additional levels, as shown for example in FIG. 8.

In another aspect, the circuit board can include third contact pads on the first major surface and fourth contact pads on the second major surface. The device can further comprise a solder ball attached to each of the fourth contact pads.

In another aspect, the printed circuit board can include third contact pads 1428 on the second major surface. A non-active surface of a third integrated circuit die can be attached to an active surface of the second integrated circuit die. Electrical connections can be formed between the third integrated circuit die and the third contact pads, as shown for example in FIG. 13.

In another aspect, the circuit board can have second vias that extend between the first major surface and the second major surface. The third contact pads terminate the second vias at the second major surface, and fourth contact pads terminate the second vias at the first major surface, as shown for example in FIG. 13.

In still other embodiments, a packaged semiconductor device can include a substrate including a first major surface, a second major surface, first vias running between the first major surface and the second major surface, first contact pads contacting the first vias at the first major surface, second contact pads contacting the first vias at the second major surface, and an opening between the first major surface and the second major surface. A first integrated circuit die can be placed in the opening in the substrate. Planform area of the opening is larger than planform area of the first integrated circuit die. A second integrated circuit die can also be included with electrical connections between the second integrated circuit die and the second contact pads. A first conductive layer is formed over the first contact pads and contact pads on a first surface of the first integrated circuit die. Encapsulating material is applied on the second major surface of the substrate around a second surface and side surfaces of the first integrated circuit die, the second integrated circuit die, the electrical connections, and in space between edges of the opening and edges of the first integrated circuit die.

In another aspect, additional conductive layers over the first conductive layer cn include a plurality of levels of conductive layers interconnected with vias through interlevel dielectric layers. A last conductive layer can have contacts for connecting the device to another component external to the device.

Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the vias may include multiple materials, such as barrier layers and fill materials. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A packaged semiconductor device, comprising:

a first integrated circuit die positioned in an opening in a circuit board, the first integrated circuit die having an active surface facing a same direction as a first major surface of the circuit board, the circuit board further comprising a second major surface, first vias running between the first major surface and the second major surface, first contact pads contacting the first vias at the first major surface, second contact pads contacting the first vias at the second major surface, the opening extending through the first major surface and the second major surface;

a second integrated circuit die adjacent a non-active surface of the first integrated circuit die;

wire bonds between the second integrated circuit die and the second contact pads;

a continuous body of encapsulant material around the first and second integrated circuit dies, the wire bonds, and the second contact pads, the encapsulant material extending from sides of the first integrated circuit die to sides of the opening in contact with the first major surface and the second major surface, the active surface of the first integrated circuit die remaining free of the encapsulant material;

a first conductive layer over the first major surface contacting the first contact pads and contact pads on the active surface of the first integrated circuit die.

2. The device of claim 1, further comprising:

solder balls between an electrical device and the first contact pads.

3. The device of claim 1, further comprising:

additional conductive layers separated by interlevel dielectric layers over the first conductive layer, the additional conductive layers being interconnected with vias.

4. The device of claim 3, further comprising solder balls connected to contact pads at a last level of the additional levels.

5. The device of claim 1, wherein the circuit board includes third contact pads on the first major surface and fourth contact pads on the second major surface, the device further comprising:

a solder bump attached to each of the fourth contact pads.

6. The device of claim 1, wherein the circuit board includes third contact pads on the second major surface, the device further comprising:

a non-active surface of a third integrated circuit die attached to an active surface of the second integrated circuit die;

electrical connections formed between the third integrated circuit die and the third contact pads.

7. The device of claim 6, wherein the circuit board has second vias that extend between the first major surface and the second major surface, the third contact pads terminate the second vias at the second major surface, and fourth contact pads terminate the second vias at the first major surface.

8. A packaged semiconductor device, comprising:

a substrate including a first major surface, a second major surface, first vias running between the first major surface and the second major surface, first contact pads contacting the first vias at the first major surface, second contact pads contacting the first vias at the second major surface, and an opening between the first major surface and the second major surface;

a first integrated circuit die in the opening in the substrate, wherein planform area of the opening is larger than planform area of the first integrated circuit die;

a second integrated circuit die;

electrical connections between the second integrated circuit die and the second contact pads;

a first conductive layer over the first contact pads and contact pads on a first surface of the first integrated circuit die; and a continuous body of encapsulating material in contact with the first major surface and the second major surface of the substrate around a second surface and side surfaces of the first integrated circuit die, the second integrated circuit die, the electrical connections, and in space between edges of the opening and edges of the first integrated circuit die.

9. The device of claim 8 further comprising:

additional conductive layers over the first conductive layer including a plurality of levels of conductive layers interconnected with vias through interlevel dielectric layers; and a last conductive layer with contacts for connecting the device to another component external to the device.

10. A packaged semiconductor device, comprising:

a first semiconductor die in an opening of a substrate, wherein the first semiconductor die has an active surface and a non-active surface, and the substrate has a first major surface and a second major surface which have the opening therethrough, first vias that extend between the first major surface and the second major surface, first contact pads terminating the first vias at the first major surface, and second contact pads terminating the first vias at the second major surface;

a continuous body of encapsulant material in contact with the first major surface and the second major surface, and in the opening around the first semiconductor die while leaving electrical contacts on the active surface of the first semiconductor die free of the encapsulant material;

a non-active surface of a second semiconductor die attached adjacent the non-active surface of the first semiconductor die;

electrical connections between an active surface of the second semiconductor die and the second contact pads;

the encapsulant material further around exposed portions of the second semiconductor die, the electrical connections, and the second contact pads;

a first conductive layer of an interconnect level over the first contact pads of the first major surface and contact pads on the active surface of the first semiconductor die.

11. The device of claim 10, wherein the encapsulant material is between sidewalls of the first semiconductor die and sidewalls of the opening.

12. The device of claim 10, further comprising:

a first dielectric layer over the first conductive layer; and openings in the dielectric layer for a plurality of vias.

13. The device of claim 12, further comprising alternating conductive and dielectric layers at a plurality of levels from the first dielectric layer.

14. The device of claim 10, wherein the substrate includes third contact pads on the second major surface, the device further comprising:

a non-active surface of a third semiconductor die attached to an active surface of the second semiconductor die;

electrical connections between the third semiconductor die and the third contact pads.

15. The device of claim 14, further comprising solder balls connected to contact pads at a last level of the plurality of levels.

16. The device of claim 14, wherein the substrate has second vias that extend between the first major surface and the second major surface, the third contact pads terminating the second vias at the second major surface, and fourth contact pads terminating the second vias at the first major surface.

17. The device of claim 10, wherein the substrate includes third contact pads on the second major surface, the device further comprising:

connecting solder sumps to the third contact pads.

* * * * *